United States Patent [19]

Radford et al.

[11] Patent Number: 5,103,103

[45] Date of Patent: Apr. 7, 1992

[54] MICROWAVE SHIELD

[75] Inventors: Kenneth C. Radford, North Huntingdon; Deborah P. Partlow, Forest Hills, both of Pa.

[73] Assignee: Westinghouse Electric Corp., Pittsburgh, Pa.

[21] Appl. No.: 555,341

[22] Filed: Jul. 19, 1990

[51] Int. Cl.⁵ .............................. G21F 1/00
[52] U.S. Cl. ...................... 250/515.1; 359/240
[58] Field of Search ............... 250/515.1; 350/353

[56] References Cited

U.S. PATENT DOCUMENTS 3,834,793  9/1974  McConnell et al. .......... 350/353
4,283,113  8/1981  Eden ........................... 350/353
4,393,095  7/1983  Greensburg .................. 427/109
4,421,985  12/1983  Billingsley et al. ........... 250/353

Primary Examiner—Bruce C. Anderson
Attorney, Agent, or Firm—W. G. Sutcliff

[57] ABSTRACT

A switchable shield which precludes transmission or receipt of radio frequency or microwave energy. The shield comprises a substrate of highly transmissive material with an active film layer disposed on the substrate. This active film layer is switchable upon heating from a high transmissivity, high resistivity mode which permits transmission or receipt of rf or microwave radiation, to a low transmissivity, low resistivity mode which precludes transmission or receipt of rf or microwave radiation through the shield.

26 Claims, 1 Drawing Sheet

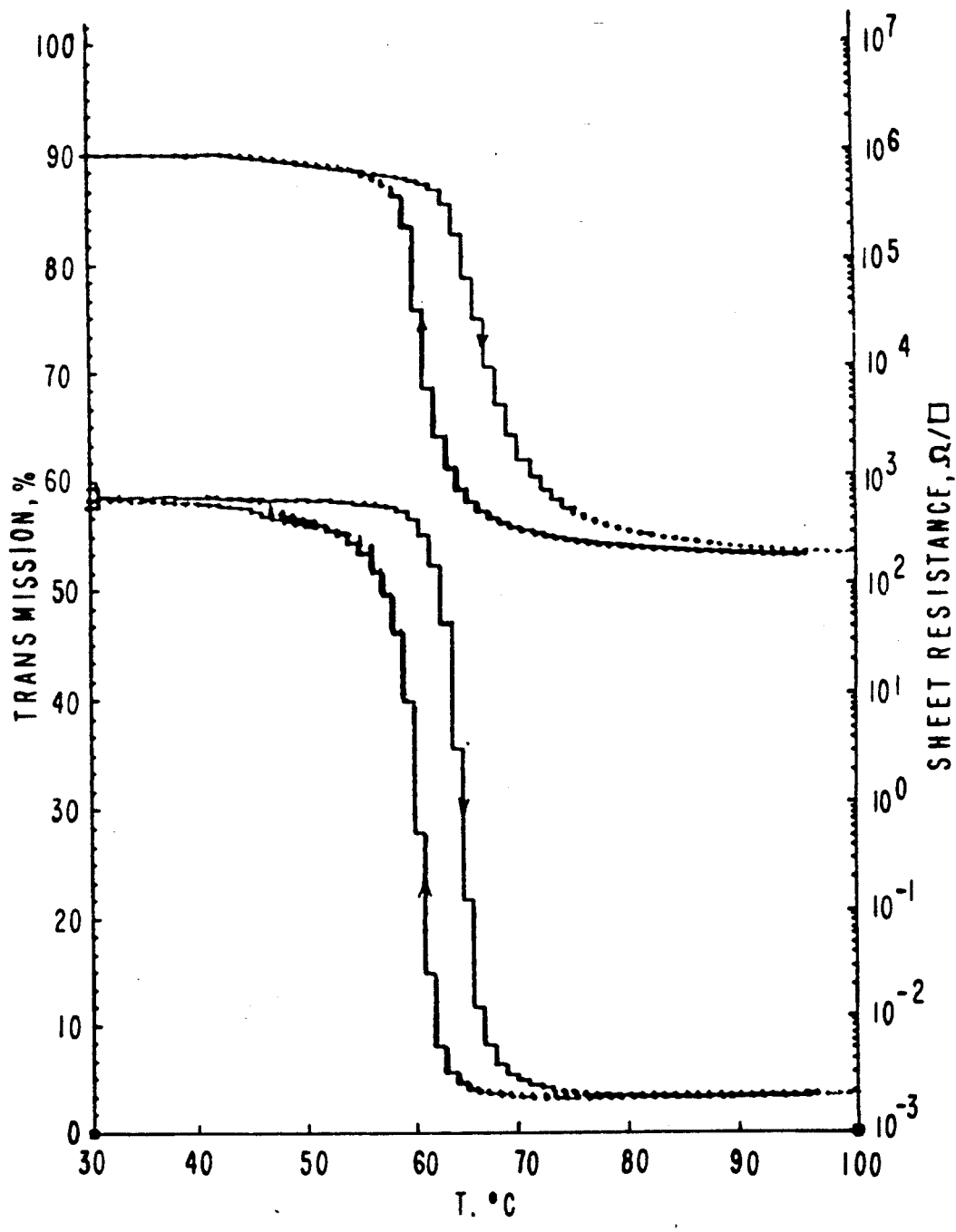

MICROWAVE SHIELD

BACKGROUND OF THE INVENTION

1. Field of the Invention

The present invention relates to a material for alternatively permitting and preventing transmission of light and other electromagnetic radiation in a controlled manner for very short time periods. More specifically, the invention relates to the use of vanadium oxide deposited on a substrate, for selectively permitting and blocking transmission of infrared (IR), microwave and radio frequency (RF) radiation therethrough.

2. Description of the Prior Art

Certain oxides of vanadium, in its various valences, are known to have varying physical properties at selected temperatures. These characteristics include the transmission of light and resistivity. This is because of a change in the crystalline structure at a certain specific temperature, which is unique to each vanadium compound. $VO_2$, which is the primary subject of this specification, has a transition temperature at approximately 68° C. At temperatures below this threshold, the compound exhibits dielectric properties and is transparent to a wide range of electromagnetic radiation, including IR and microwave frequencies. At temperatures above the 68° C. threshold, the compound is metallic in character, exhibiting electrical conducting properties and being opaque to most electromagnetic radiation. If properly formulated, this transition from the dielectric to the metallic state occurs over a very narrow temperature range.

$VO_2$ is the preferred compound for the application disclosed herein because of this narrow temperature range in which the transition takes place. Other vanadium-based compounds, such as $V_2O_3$, exhibit similar properties, but at low transition temperatures which are not as easily controlled outside the laboratory.

The switchable properties of this and similar compounds have been utilized in a number of different applications Nalepa, et al., U.S. Pat. No. 3,993,603, issued Nov. 23, 1976; McHugh, et al., U.S. Pat. No. 4,056,378, issued Nov. 1, 1977 and Emtage, et al., U.S. Pat. No. 3,975,657, issued Aug. 17, 1976, all disclose the use of a $VO_2$ and $MoO_2$ mixture to reduce current inrush in incandescent light bulbs. Light bulbs having tungsten filaments are susceptible to damage because of melting from large current overshoots when the bulb is activated. The vanadium/molybdenum compound exhibits higher resistance at lower temperatures, such that when placed in series with the filament, the resistor reduces the initial current peak. As the bulb heats, the resistance is lowered and the bulb achieves its maximum brightness. The molybdenum is added to make the transition from high resistance to low resistance a more gradual one.

Ueoka, et al., U.S. Pat. No. 4,022,716, issued May 10, 1977 utilizes vanadium oxide as an additive in the manufacture of semiconducting ceramics. The use of vanadium oxide and other materials such as iron and manganese in such compounds broadens the range of resistivity in the base materials. The use of vanadium oxide specifically in these compounds gives a broader range than the other elements, and also allows for finer gradations between selected resistivities. This is because of the small changes in resistivities occurring from relatively large additions of the vanadium oxide.

What has not been recognized by the art, however, is the application of the switchable vanadium oxide compounds for selectively permitting and preventing the passage of electromagnetic radiation therethrough, based on the metallic and dielectric properties exhibited by the compound. This is especially applicable in the use and detection of IR, microwave or RF transmitters and receivers.

SUMMARY OF THE INVENTION

A vanadium oxide compound having the formula $VO_2$ is disclosed for the purpose of selectively shielding an electromagnetic transmitter or receiver. Vanadium oxide exhibits a marked and rapid transition from a dielectric semiconducting state which is transparent to electromagnetic radiation, to a metallic state, which is impervious to such radiation above a specific temperature, approximately 68° C. The compound is preferably mounted as a thin layer on a substrate which has been specifically selected for the desired application. For example, if a specific IR range of radiation were to be selectively transmitted through the compound shield, the substrate must be able to allow transmission of this IR wavelength range. If not, the characteristics of the layer of vanadium oxide would be rendered irrelevant.

These and other advantages and features of the present invention will be more fully understood on reference to the presently preferred embodiments thereof and to the appended drawings.

BRIEF DESCRIPTION OF THE DRAWING

The FIGURE is a graphical representation of the transmissivity and resistivity of the $VO_2$ compound.

DESCRIPTION OF THE PREFERRED EMBODIMENTS

Vanadium oxide undergoes a first order phase transformation at 68° C. from a low temperature monoclinic geometry to a high temperature tetragonal structure. The electrical and optical properties are dramatically altered across this phase transition. The electrical and optical properties of the material are strongly dependent on the stoichiometry of the compound, and $VO_2$ in its purest form is preferred. This particular embodiment exhibits the narrowest transitional temperature range at the target temperature.

Referring to the FIGURE, the transmissivity and resistivity properties of a 2000 Å $VO_2$ thin film on a sapphire substrate are shown. In the low temperature state, the compound exhibits nearly no change in transmissivity below 60° C. Resistivity decreases only slightly within this low temperature phase, and exhibits no significant change below 62° C. Both resistivity and transmissivity change radically over a 5° C. temperature range centered around the critical 68° C. temperature.

As also shown in the FIGURE, under increasing temperature conditions, resistivity decreases approximately three orders of magnitude, from $10^6$ Ω per square to almost 1000 Ω per square. In use, however, the resistivity is preferably greater than the three orders of magnitude shown. Transmissivity for the displayed compound drops from approximately 60% to approximately 5% over the same range. Transmissivity, unlike resistivity, however, is dependent on film thickness, radiation wavelength and the substrate utilized It is therefore selectable for each individual application. It should also be noted that the transmissivity is a result of the reflectivity of the film coating. The reflectivity may be reduced, increasing the transmissivity through the use of anti-reflective coatings on the shield. The use of such coatings may increase transmissivity to approximately 90%, without affecting the low transmissivity of the metallic state. Typical applications could contemplate transmissivity ranges from approximately 90% to approximately 0%.

With further reference to the FIGURE, some hysteresis is observed in returning the compound to its semiconducting state. While decreasing the temperature, a significant change is not observed in transmissivity above 61–62° C., while resistivity remains low above 63–64° C. It should be noted, however, that the phase change from the metallic to the semiconducting phase occurs over an equally narrow range as the opposite transformation. It should also be specifically noted that these rapid changes in phase over small temperature ranges of a few degrees celsius are necessary for the practice of the invention. A transformation over a 3° C. range is preferred for rapid switching.

The compound shield is intended primarily for camouflage and concealment of RF, microwave and IR transmitters. The equipment utilized is capable of emitting and receiving the transmissions in a matter of microseconds. It is necessary, therefore, for the shield to be open only as long as is required for the emission or reception of the electromagnetic waves. During the remainder of the time, the shield is in the metallic state to camouflage the transmitter. This critical time element dictates that the switchable film also be transformed from metallic to semiconducting to metallic again in a matter of microseconds. This is achievable only if the compound is properly designed according to three parameters. The first is the purity of the $VO_2$ thin film itself. The second is the thickness of the film layer. The third is the selection of the proper substrate, to support the thin film layer. The specific embodiments of these parameters are, however, dictated by the individual characteristics of the shield application This is based on the wavelength of the radiation to be passed through the shield, the choice of substrate for transparency at this wavelength and the electrical properties of the film necessary to provide the camouflage effect.

Switchable $VO_2$ can be produced in thin film form using a variety of traditional film deposition techniques such as magnetron sputtering, RF sputtering, reactive ion sputtering, ion beam sputtering, evaporation, deposition of vanadium metal followed by oxidation. Any of these methods can be used to produce continuous films, or with suitable masking to produce a periodic array of resistive elements, which is disclosed herein. However, techniques which use vacuum equipment such as those listed above are difficult to control in terms of the V:O ratio and also present scaling problems for applications where the arrays need to be large in size, for example, covering areas greater than a few inches in diameter. The vacuum equipment required to deposit these films is also complex and expensive. For these reasons, we prefer to use the sol-gel method to deposit vanadium oxide in its fully oxidized condition, $V_2O_5$, and convert it to $VO_2$ by heating in an atmosphere of appropriate oxygen partial pressure.

Utilizing the sol-gel process, each film composition will display some limits in the solution processing that must be followed if high quality films are to be obtained. For vanadium oxide films, the method begins with the preparation of a precursor solution using a vanadium alkoxide. A clear, stable solution (no precipitate) suitable for film deposition must be prepared. Although most clear solutions give acceptable coatings, the film thicknesses vary with the deposition rate. The preferred deposition apparatus utilized is a dipping machine capable of pull rates from 40–85 cm/min. Solution concentrations in the 2–6 weight percent equivalent $VO_2$ range gave acceptable films using this apparatus. We have found that lower solution concentrations create continuous films which are generally too thin to be opaque in the metallic state and do not change as dramatically when switched. At higher concentrations, the films crack or spall from the substrate during subsequent heating steps used to convert the as-deposited film to $VO_2$. Single layer thicknesses are generally in the range of 2000 Å to 10,000 Å, and are preferably 4000 Å to 8000 Å. The actual thickness for a particular application will vary dependent on the electrical properties of the shield which are required.

It is to be understood, however, that in an application which contemplates the use of a discontinuous film layer, the thickness may be acceptable in a lower range than in the continuous embodiment. In that situation, thin films as thin as 100 521 can be produced by this process and are of high quality and utility. Pull rates substantially higher than 85 cm/min and/or concentrations greater than 6 weight percent generally result in films of undesirably high thickness.

If thicker films are required by a specific application for either embodiment, intermediate film thicknesses of 2000 to 4000 Å are easily obtained, and thicker films can be prepared by depositing layers of films having an intermediate thickness from a single deposition in sublayers, with an intermediate heating step under a heat source.

It should also be mentioned that spinning can be used to deposit these films, but this is only good for small, flat, round substrates. It is specifically intended that other methods for depositing liquid films such as spraying or rolling may have application.

After deposition, the film is allowed to dry in a moisture-free environment. This avoids reactions with water, which can ruin the film. Next the film must be heated in air or other oxidizing environment to remove organic components. The maximum temperature used for this step should not come too close to the melting point of $V_2O_5$, which is 670° C. The resulting film is polycrystalline $V_2O_5$.

The $V_2O_5$ is then heated in a suitable reducing gas to convert it to $VO_2$. To circumvent the difficult task of providing a true equilibrium condition, a steady state condition should be provided such that the only oxide of vanadium that can exist is $VO_2$. This may be achieved by fine tuning the gas flow rate and the temperature, and can be obtained regardless of the oxidation state of the vanadium prior to this step. In other words, films having a higher oxygen content or a lower oxygen content may be similarly converted to $VO_2$, which is proof of the steady state condition. Exact rates that are required depend on the volume and configuration of the furnace.

Films prepared without going through the $V_2O_5$ state, which may contain a carbonaceous residue, or films which are not of the correct oxygen stoichiometry will exhibit a greater temperature change to complete the switching from semiconducting to metallic. This translates to a slower or more sluggish switch.

The method described can produce switchable films on a variety of substrates and has been demonstrated on SiO₂, semiconductor silicon, Al₂O₃, ZnS, ZnSe and BaF₂. This is an advantage because the choice of materials covers a wide spectral range. The switching properties of VO₂ films made by the steady-state reduction of sol-gel derived V₂O₅ is excellent, approaching the performance of a single crystal of VO₂. Doping agents may be utilized to change the transition temperature or alter the switching characteristics of the VO₂. Materials such as chromium, molybdenum, titanium, manganese, nickel, iron, cobalt, tungsten and phosphorus may be utilized for this purpose. All of these may, however, produce a more sluggish switch than the pure vanadium oxide compound.

Substrates useful for transmission of RF and microwave radiation include glass, quartz, zirconia, corderite, polycrystalline aluminum oxide, aluminosilicates, aluminum nitride, boron nitride, silicon nitride, silicon carbide and sapphire. All of these materials have a relatively low dielectric constant. The preferred substrates for IR transmission are silicon, germanium, calcium fluoride, barium fluoride, zinc sulfide, zinc selenide, diamond and gallium arsenide.

The transition between the phases of the compound shield is achieved through a change in temperature. This can be achieved in a variety of ways, such as the passage of chilled or warmed air over the surface. The transmission of radiation is then temperature selected. In either mode, the effects are bidirectional.

The ambient temperature of the subject device is dictated by factors other than the VO₂ film itself. To be practical for certain applications, the transparent condition must be achievable within microseconds, and this is done by changing the temperature. Considering the relatively low thermal conductivity of most transparent substrates, the device should be biased at a temperature not more than five degrees above the switching temperature. 68° C. This allows the operator to change from the metallic to the semiconducting phase by cooling the shield quickly. Recovery time may also be critical in certain applications in which the shield must be opened for only a few microseconds to allow an RF pulse to be emitted and received, for example.

In the RF situation, the metallic phase is utilized to conceal the transmitting and/or receiving unit most of the time, since it is this unit that permits detection. When emission or reception is desired, the shield is momentarily converted to the semiconducting phase, the transmission is completed, and the shield is switched rapidly back to the metallic phase.

It should be specifically noted that for other applications, the exposure time may not be as critical, and the temperature might be allowed to fall as much as 10 or 20° C. below the transition temperature without compromising the function of the system. In any case, temperature control between approximately 50 and 75° C. must be exercised to allow for rapid switching.

An alternative embodiment to ambient air switching is electrical switching. In this embodiment, an electrical current is passed through the thin film. The heat generated by the electricity passing through the resistive material causes the phase switch. This method, however, is not preferred because of several shortcomings. The most pertinent of these is the fact that the current continues to flow through the material in the semiconducting state. This creates shorts across the surface of the material, generally in the form of metallic portions interspersed within the semiconducting surface. These metallic portions can hamper or block transmission through the shield. Additionally, the conductors necessary to place the shield in the electronic circuit could interfere with transmission through the shield.

While we have described a present preferred embodiment of the invention, it is to be distinctly understood that the invention is not limited thereto but may be otherwise embodied and practiced within the scope of the following claims.

We claim:

1. A switchable shield for an electromagnetic device which transmits or receives radio frequency or microwave radiation through said shield, which shield is selectively switchable form a first high transmissivity, high resistivity mode to a second low transmissivity, low resistivity mode, which shield comprises:

a substrate formed of a material which is highly transmissive of radio frequency and microwave radiation; and an active film layer disposed on said substrate, which active film layer is switchable upon heating above a selected temperature from said first high transmissivity, high resistivity mode permitting transmission or receipt of radio frequency or microwave radiation by said electromagnetic device, to said second low transmissivity, low resistivity mode precluding transmission or receipt of radio frequency or microwave energy by said electromagnetic device.

2. A switchable shield as described in claim 1, wherein the active film layer is comprised of vanadium oxide.

3. A switchable shield as described in claim 2, wherein the vanadium oxide consists essentially of VO₂.

4. A switchable shield as described in claim 3, wherein the active film layer in the high transmissivity mode is semiconducting.

5. A switchable shield as described in claim 4, further characterized in that the active film layer in the high transmissivity, high resistivity mode has a monoclinic structure.

6. A switchable shield as described in claim 3, further characterized in that the active film layer in the low transmissivity, low resistivity mode is metallic.

7. A switchable shield as described in claim 6, further characterized in that the active film layer in the low transmissivity, low resistivity mode is tetragonal in structure.

8. A switchable shield as described in claim 2, further comprising a doping agent which alters the selected temperature.

9. A switchable shield as described in claim 8, wherein the doping agent is selected from the group consisting of chromium, molybdenum, titanium, manganese, nickel, iron, cobalt, tungsten and phosphorus.

10. A switchable shield as described in claim 1, wherein the active film layer is discontinuous.

11. A switchable shield as described in claim 1, wherein the active film layer has a thickness in the range of 100 Å to 10000 Å.

12. A switchable shield as described in claim 11, wherein the active film layer is further comprised of a plurality of film sublayers, each having a thickness of at least 100 Å.

13. A switchable shield as described in claim 11, wherein the active film layer is comprised of a single layer, having a thickness in the range of 2000 Å to 10000 Å.

14. A switchable shield as described in claim 13, wherein the single active film layer has a thickness of approximately 4000 Å to 8000 Å.

15. A switchable shield as described in claim 1, further characterized in that the active film layer changes from the first mode to the second mode at approximately 68° C.

16. A switchable shield as described in claim 15, wherein the active film layer is changed from the first mode to the second mode by heating with a forced air flow over the active film layer.

17. A switchable shield as described in claim 15, further characterized in that the active film layer is changed from the first mode to the second mode by passing an electric current therethrough to heat the active film layer.

18. A switchable shield as described in claim 1, wherein the active film layer changes from the first mode to the second mode over a narrow temperature range.

19. A switchable shield as described in claim 18, wherein the narrow temperature range is 3° C.

20. A switchable shield as described in claim 1, wherein the substrate layer is selected from the group consisting of glass, quartz, zirconia, corderite, polycrystalline aluminum oxide, aluminosilicates, aluminum nitride, boron nitride, silicon nitride, silicon carbide and sapphire.

21. A switchable shield as described in claim 20, wherein the alumino-silicates are selected from the group consisting of mullite and celsian.

22. A selectably shield as described in claim 1, wherein the substrate layer is selected from the group consisting of glass, quartz, zirconia, corderite, polycrystalline aluminum oxide, aluminosilicates, aluminum nitride, boron nitride, silicon nitride, silicon carbide and sapphire.

23. A switchable shield as described in claim 22, wherein the alumino-silicates are selected from the group consisting of mullite and celsian 24. A selectably intermittent shield as described in claim 1, wherein the substrate layer is formed from a material which is transparent to infrared electromagnetic radiation and is selected from the group consisting of silicon, germanium, calcium fluoride, barium fluoride, zinc sulfide, zinc selenide, diamond and gallium arsenide.

25. A switchable shield as described in claim 1, further characterized in that the resistivity of the active film layer decreases from approximately $10^6$ $\Omega$ per square to approximately 1000 $\Omega$ per square when changed from the first mode to the second mode.

26. A switchable shield as described in claim 1, further characterized in that the transmissivity of the active film layer drops from approximately 90% to approximately 0% when changed from the first mode to the second mode.

* * * * *